United States Patent [19]
Blyth et al.

[11] Patent Number: 5,963,106
[45] Date of Patent: Oct. 5, 1999

[54] DOUBLE-SIDED PULSE WIDTH MODULATOR

[75] Inventors: Trevor A. Blyth; Benjamin E. Nise, both of Sandy, Utah; David A. Wayne, Scottsdale, Ariz.

[73] Assignee: Sonic Innovations, Inc., Salt Lake City, Utah

[21] Appl. No.: 09/039,925

[22] Filed: Mar. 16, 1998

[51] Int. Cl.[6] .................................................. H03K 7/08
[52] U.S. Cl. ........................ 332/109; 332/110; 375/238; 327/172; 327/176
[58] Field of Search ..................... 332/109–111; 375/238; 327/172, 175, 176

[56] References Cited

U.S. PATENT DOCUMENTS

| | | | |
|---|---|---|---|
| 4,545,065 | 10/1985 | Visser ........................................ | 381/41 |
| 4,588,960 | 5/1986 | Salama, et al. ......................... | 330/264 |
| 4,592,087 | 5/1986 | Killion ...................................... | 381/68 |
| 4,685,042 | 8/1987 | Severinsky ............................... | 363/41 |
| 4,689,819 | 8/1987 | Killion ...................................... | 381/68 |
| 5,014,016 | 5/1991 | Anderson ................................. | 330/10 |
| 5,099,856 | 3/1992 | Killion et al. ........................... | 128/731 |
| 5,162,751 | 11/1992 | Blanken et al. ......................... | 230/257 |
| 5,247,581 | 9/1993 | Gurcan .................................... | 381/68.4 |
| 5,317,640 | 5/1994 | Callias ..................................... | 381/68.4 |
| 5,378,933 | 1/1995 | Pfannenmueller et al. ............ | 327/172 |
| 5,389,829 | 2/1995 | Milazzo ................................... | 327/172 |
| 5,451,893 | 9/1995 | Anderson ................................. | 327/174 |
| 5,506,532 | 4/1996 | Milazzo ................................... | 327/175 |
| 5,512,857 | 4/1996 | Koskowich .............................. | 330/252 |

FOREIGN PATENT DOCUMENTS

| | | | |
|---|---|---|---|
| 0 534 804 | 3/1993 | European Pat. Off. ........ | H03F 3/217 |
| 0 590 903 | 4/1994 | European Pat. Off. ........ | H03F 3/217 |
| 83/0221 | 6/1983 | WIPO ............................ | H04R 25/00 |

*Primary Examiner*—David Mis
*Attorney, Agent, or Firm*—D'Alessandro & Ritchie

[57] ABSTRACT

In a double-sided pulse width modulator, an amplifier has a first input connected to a first reference potential, a second input, and an output. A first bank of storage elements have a first terminal connected to the second input of the amplifier, and a second terminal. A first bank of switches have an output terminal connected to a second terminal of the storage elements, an input terminal, and a control terminal connectable by a timing gate to an output of the modulator and a polarity control bit for a first value to be input into the input terminals. A feedback storage element is connected in parallel with a first timing switch between the second input of the amplifier and the output of the amplifier. A comparator has a first input connected to a second reference potential, a second input, a timing enable input, and an output. A second bank of storage elements have a first terminal connected to the second input of the comparator, and a second terminal. A second timing switch is connected in parallel with a first one of the storage elements of the second bank of storage elements between the output of the amplifier and the second input of the comparator. A second bank of switches have a first terminal connected to one of the storage elements in the second bank of storage elements other than the one storage element, a second terminal connected to the output of the amplifier, and a control terminal connected to a second input value. A current source is connected to the second input of the comparator to discharge a value having a duration proportional to the product of the first input value and the second input value to form the output of the modulator at the output of the comparator.

3 Claims, 9 Drawing Sheets

FIG. 1

| EXPONENT BITS ($e_2e_1e_0$) | EXPONENT DECODE E7–E1 | CAPACITOR VALUE |
|---|---|---|
| 000 | 0000000 | C' |
| 001 | 0000001 | 2C' |
| 010 | 0000011 | 4C' |
| 011 | 0000111 | 8C' |
| 100 | 0001111 | 16C' |
| 101 | 0011111 | 32C' |
| 110 | 0111111 | 64C' |
| 111 | 1111111 | 128C' |

| EXPONENT BITS ($e_2e_1e_0$) | EXPONENT DECODE E7–E0 | CAPACITOR VALUE |
|---|---|---|
| 000 | 00000001 | C' |
| 001 | 00000010 | 2C' |
| 010 | 00000100 | 4C' |
| 011 | 00001000 | 8C' |
| 100 | 00010000 | 16C' |
| 101 | 00100000 | 32C' |
| 110 | 01000000 | 64C' |
| 111 | 10000000 | 128C' |

DOUBLE-SIDED PULSE WIDTH MODULATOR

BACKGROUND OF THE INVENTION

1. Field of the Invention

The present invention relates to a pulse width modulated power amplifier. More particularly, the present invention relates to a Class D power amplifier where the modulation of the pulse width is preferably double-sided.

2. The Prior Art

Class D amplifiers have significant advantages compared to other types of power amplifiers such as Class A or Class B, especially with respect to power consumption. The output devices of a Class D amplifier operate in switched mode and, in the steady state, are either fully on or fully off. The fully on device has low impedance and, therefore, the power dissipation within the device itself is low. The fully off device is not passing current and dissipation is therefore low in this device also. In contrast, Class A or Class B devices operate for a large proportion of time with a voltage drop across the output device while they are conducting current and therefore dissipate power during these times. As a result, Class A and B devices are less efficient and reduce the useful battery life in battery-powered equipment and/or create the need for heatsinks in high output power stages.

Examples of Class D amplifiers include the Harris Semiconductor H1P4080 Class D amplifier described in "Class D amplifiers provide high efficiency for audio systems" Jeffrey D. Sherman, EDN May 25, 1995, pp. 103–110, and U.S. Pat. No. 4,592,087 to Killion. Both the Harris and the Killion references describe devices that accept input in analog form and operate on the principle of summing a triangular waveform together with an analog signal and comparing the result with a fixed analog voltage. The result of the comparison is used to generate the pulse width modulated output.

In "Reduction of Spectral Distortion in Class D amplifiers by an Enhanced Pulse Width Modulation Sampling Process", P. H. Mellor, S. P. Leigh, B. M. G. Cheetham, IEE Proc., Part G, 138, No. 4, 441–448 non-uniform sampling schemes have been reported which improve output quality compared to uniform sampling. However, a naturally sampled system is very difficult to achieve in a digital system because continuous interpolation must be performed to provide the adjusted input sample at the precise time of the output transition. Further, in applications such as portable audio systems and hearing aids the added complexities of the interpolation calculations are not justified for the intended audio quality levels.

Another circuit having Class D operation is the Delta-Sigma Digital to Analog Converter, in which a multi-bit digital representation is converted into a highly oversampled single bit output. The output is a train of pulses of equal width that, after filtering, produces the analog voltage corresponding to the multi-bit digital input. Delta-Sigma DAC architectures are described in "Delta-Sigma Data Converters Theory, Design and Simulation" IEEE Press, S. R. Norsworthy, R. Schreier, G. Temes Chapter 10. Operation is Class D since the output waveform is a train of digital pulses and the output devices are operated in switching mode. The analog filter used to filter the output pulses can be quite simple due to the high oversampling rate. In the case of audio signals, filtering can be achieved by the inductance of the loudspeaker itself. The oversampled converter provides a high precision output with low precision analog components at the cost of significant increase in complexity of the digital circuits.

According to this approach, power consumption, while good, is increased due to losses arising from the high frequencies and the large number of transients. It will appreciated that in applications such as hearing aids low, low power consumption is a critical issue. For example, in hearing aids, the circuit typically operates from a single zinc-aid cell that has a nominal voltage output of 1.3 Volts, a capacity of about 70 mAhr and, together with microphone, loudspeaker and audio processing circuits, must operate for at least 100 hours on a single cell.

It is therefore an object of the present invention to provide a low power, digital-to-pulse width modulated power amplifier.

BRIEF DESCRIPTION OF THE INVENTION

According to the present invention, a floating point digital input having a mantissa potion and an exponent portion is input to a pulse width modulator to form a pulse width at the output that is modulated on both edges of the pulse. The mantissa is input to a switched capacitor amplifier in a first portion of the double-sided pulse width modulator, and the exponent is input to a capacitor bank in a second portion of the pulse width modulator. The product of the mantissa and the exponent form a voltage at a first input of a comparator having a discharge time that is proportional to the width of the output pulse of the double-sided modulator. The pulse width is modulated on both sides, and the modulation is performed in two cycles of operation.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
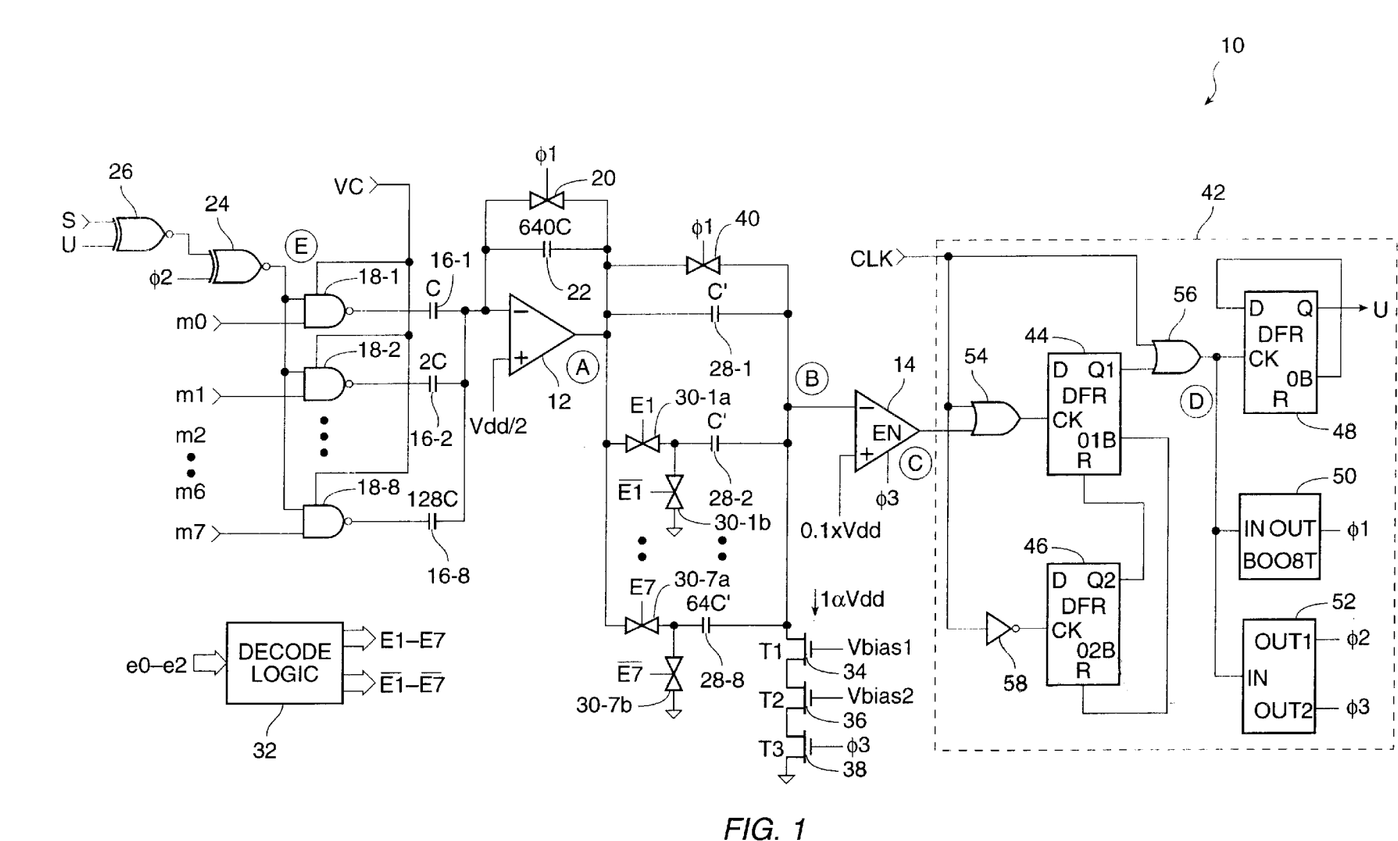
FIG. 1 illustrates a double-sided pulse width modulator according to the present invention.

In FIG. 1, a double-sided pulse width modulator 10 according to the present invention is illustrated. It is contemplated according to the present invention, that the double-sided pulse width modulator 10 will operate on a digital input that in the preferred embodiment is a signed floating point number which includes 1 bit, S, for the sign, 8 bits, m0–m7, for the mantissa, and 3 bits, e0–e2, for the exponent. In alternative embodiments to be described below, other number representations and decoding schemes in accordance with the principles of the present invention will be disclosed.

The sampling of the digital input is uniform, and the output, U, of the double-sided pulse width modulator 10 is a pulse wave form of fixed frequency. According to the present invention, the width of the output pulse is modulated in proportion to the digital input value. Preferably, the modulation of the output pulse is double-sided, rather than single sided. Those of ordinary skill in the art will appreciate that for double-sided modulation of a pulse, the width of the pulse will be increased or decreased on both the rising edge and the falling edge of the pulse. In contrast, for single-sided modulation, only one of the edges of the pulse is increased or decreased while the remaining edge is kept fixed relative to the sampling interval.

The double-sided pulse width modulator 10 includes a switched capacitor amplifier 12 having a non-inverting input, an inverting input and an output, and a comparator 14 having a non-inverting input, an inverting input and an output. The double-sided pulse width modulator 10 according to the present invention is very tolerant of many of the sources of non ideal behavior. This is due to the fact that many of the sources of non ideal behavior have a similar effect on both the positive and negative edges of the pulse width output, U, of the double-sided pulse-width modulator 10. Some examples of these sources of non ideal behavior include the switched capacitor amplifier 12 and comparator 14 offsets, CLK feed through, inaccuracies in Vdd, and well-known propagation delays in logic gates and comparator 14.

In a first portion of the double sided pulse width modulator 10, the non-inverting input of the switched capacitor amplifier 12 is connected to a reference potential Vdd/2, and the inverting input of the switched capacitor amplifier 12 is connected to one side of each capacitor in a first bank of capacitors 16-1 through 16-8. The other side of each individual capacitor in the first bank of capacitors 16-1 through 16-8 is connected, respectively, to the output of one of the two-input NAND gates 18-1 through 18-8. In the preferred embodiment, the first bank of capacitors 16-1 through 16-8 are weighted as C, 2 C, 4 C, 8 C, 16 C, 32 C, 64 C, and 128 C. The two-input NAND gates 18-1 through 18-8 driving the first bank of capacitors 16-1 through 16-8 are illustrated as logic gates. It should be appreciated by those of ordinary skill in the art that the two-input NAND gates 18-1 through 18-8 may be replaced with transistor switches A first switch 20, and a capacitor 22 weighted at 640 C are connected between the inverting input and the output of switched capacitor amplifier 12. First switch 20 is controlled by a first timing signal, φ1, to be described below. The capacitor 22 in the feedback path of the switched capacitor amplifier 12 is sized to keep the output of the switched capacitor amplifier 12 within the limits of the voltage supplied to the switched capacitor amplifier 12 so that the switched capacitor amplifier 12 does not saturate.

A first input of each of the two-put NAND gates 18-1 through 18-8 is input with one of the mantissa bits m0–m7. A second input of each of the two-input NAND gates 18-1 through 18-8 is connected to the output of a first two-input XNOR gate 24. A first input of the first two-input XNOR gate 24 is input with a second timing signal, φ2, to be explained below, and a second input of the first two-input XNOR gate 24 is connected to the output of a second two-input XNOR gate 26. A first input of the second two-input XNOR gate 26 is input with the sign bit, S, and a second input of the second two-input XNOR gate 26 is input with the output, U, of the double-sided pulse width modulator 10.

In a second portion of the double sided pulse width modulator 10, the non-inverting input of the comparator 14 is connected to a reference potential of 0.1 Vdd, and the inverting input of the comparator 14 is connected to one side of each capacitor in a second bank of capacitors 28-1 through 28-8. The enable signal for comparator 14 is connected to a third timing signal, 43, to be described below. In the preferred embodiment, the second bank of capacitors 28-1 through 24-8 are weighted as C', C', 2 C', 4 C', 8 C', 16 C', 32 C', and 64 C', respectively. The other side of capacitor 28-1 is connected directly to the output of amplifier 12, while the other side of each individual capacitor in the second bank of capacitors 28-2 through 28-8 may be connected alternatively by a separate pair of switches for each of the individual capacitors 28-2 through 28-8 to either the output of amplifier 12 or to ground.

The second bank of capacitors 28-1 through 28-8 may be implemented with the desired number of unit sized capacitors C', or may be implemented according to other practices employed to ensure good matching as is known to those of ordinary skill in the art. Although the capacitors within each of the first and second banks of capacitors 16-1 through 16-8, and 28-1 and 28-8 must be matched within their respective banks, it is not required that the capacitors between the first and second banks of capacitors 16-1 through 16-8, and 28-1 and 28-8 be matched.

In each pair of switches 30-1a and 30-1b through 30-7a and 30-7b, a first terminal in each of the switches in each pair of switches is connected to one of the capacitors in the second bank of capacitors 28-2 through 28-8. A second terminal of the switches 30-1a through 30-7a is connected to the output of amplifier 12, and a second terminal of the switches 30-1b through 30-7b is connected to ground. The pairs of switches 30-1a and 30-1b through 30-7a and 30-7b may be implemented in a variety of ways known to those of ordinary skill in the art, including, for example, pairs of pass transistors.

Each of the switches in the pairs of switches 30-1a and 30-1b through 30-7a and 30-7b has a control input connected to the output of decode logic 32. The exponent bits e0–e2 are decoded by decode logic 32 to provide eight pairs of bits, E1/$\overline{E1}$ through E7/$\overline{E7}$ as control signals for the eight pairs of switches 30-1a and 30-1b through 30-7a and 30-7b. The implementation of the decode logic 32, is well within the level of skill of those of ordinary skill in the art and will not be disclosed herein to avoid over complicating the disclosure and thereby obscuring the present invention.

Figure 2:
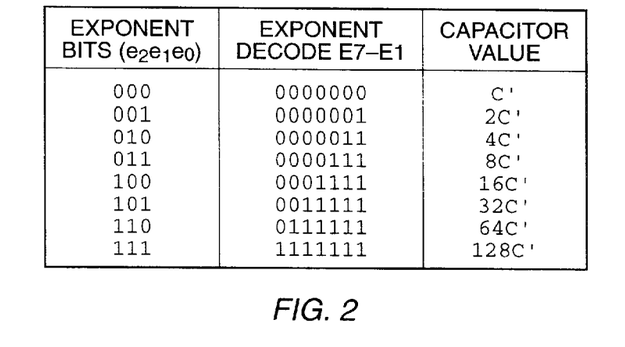
FIG. 2 illustrates a decode scheme for exponent bits suitable for use according to the present invention.

The exponent bits e0–e2 are decoded into switch control bits E1/$\overline{E1}$ through E7/$\overline{E7}$ according to the decode scheme indicated in FIG. 2. When a decode bit is a logic '1', the associated switch 30-1a through 30-7a is turned on and the Δ voltage at the output of the switch capacitor amplifier 12 is connected to the capacitor 28-1 through 28-8 associated with the switch 30-1a through 30-17a. Otherwise, if the decode bit is a logic '0', the switch 30-1a through 30-7a is turned off and the complemented switch 30-1b through 30-7b connects the associated capacitor 28-1 through 28-8 to ground. It will be appreciated as the value of the exponent bits e0–e2 increases, that more of the switches 30-1a through 30-7a will be turned on. The combination of the input decoding and the capacitor sizing in the bank of second capacitors 28-1 through 28-8 implements an exponent for the mantissa connected to the NAND gates 18-1 through 18-8.

Also connected to the inverting input of comparator 14 is a first one of three series-connected N-channel MOS transistors 34, 36, and 38. In the series connection, the source of N-channel MOS transistor 34 is connected to the drain of N-channel MOS transistor 36, the source of N-channel MOS transistor 36 is connected to the drain of N-channel MOS transistor 38, and the source of N-channel MOS transistor 38 is connected to ground. N-channel MOS transistors 36, 38, and 40 are controlled by signals Vbias1, Vbias2, and a third timing signal φ3, respectively, to be described below. The N-channel MOS transistors 34, 36, and 38 form a current source. A second switch 40 is controlled by the first timing signal, φ1, and is connected between the output of amplifier 12 and the inverting input of comparator 14.

According to the present invention, a third portion of the double-sided pulse width modulator 10 shown within dashed line 42 is responsive to the output of the comparator 14 and the clock signal, CLK, to provide first, second and third timing signals φ1, φ2, and φ3 and the output U, of the double-sided pulse width modulator 10. Portion 42 includes first, second and third D-type flip-flops, 44, 46, and 48, buffer circuits 50 and 52, first and second two-input OR gates 54 and 56, and inverter 58. Buffer circuit 50 may be implemented as a bootstrap circuit to generate a HIGH level on timing signal φ1 that is greater than Vdd, as is well known in the art. The boosted voltages on timing signal φ1 are selected to improve the conduction of switches 20 and 40 for all possible voltages of analog signals applied to switches 20 and 40, especially for low values of Vdd.

In the operation double-sided pulse width module 10, a voltage dependent on the values of the mantissa and exponent bits, m0–m7 and e0–e2, respectively, is placed at the inverting input of the comparator 14, according to timing relationships to be described. The voltage at the inverting input of the comparator 14 is then discharged through N-Channel MOS transistors 34, 36 and 38. When the input of comparator 14 discharges to the reference voltage, preferably 0.1 Vdd at the non-inverting input of the comparator 14, a HIGH level is output from the comparator 14. The width of the output pulse of the double-sided output pulse modulator 10 is proportional to the length of the time of the discharge of the voltage at the inverting input of comparator 14. When the voltage placed at the inverting input of the comparator 14 falls to the reference voltage, preferably, 0.1 Vdd at the non-inverting input of the comparator 14, a step is output from the comparator 14.

While it is desirable in the double-sided pulse-width modulator 10 that the current source formed by N-Channel MOS transistors 34, 36 and 38 is linear over the operating range of Vdd to 0.1 Vdd in order to maintain a linear discharge rate, the present invention is tolerant to non-linearities that add and subtract equally to the discharge times. For example, it will be appreciated by those of ordinary skill in the art, that as the voltage at the node connected to the inverting input of the comparator 14 approaches the reference voltage, 0.1 Vdd, that the cascode effect diminishes, and a reduced drain voltage on the N-Channel MOS transistor 36 may cause a reduction in the drain current. Yet, this non-linearity is tolerated, because the increased discharge time resulting from the non-linearity in the current due to the reduced drain voltage is the same for all cycles, give that the voltage at the node connected to the inverting input of comparator 14 does not begin its discharge in the nonlinear part of the current characteristic. Otherwise, the output would suffer distortion.

As stated above, the portion 42 of the double-sided output pulse modulator 10 has two inputs, the CLK input and the output of comparator 14. The CLK input is connected to the first input of the first two-input OR gate 54, a first input of the second two-input OR gate 56, and through the inverter 58 to the clock input of second D-type flip-flop 46. The output of the comparator 14 is connected to the second input of the first two-input OR gate 54.

Figure 3:
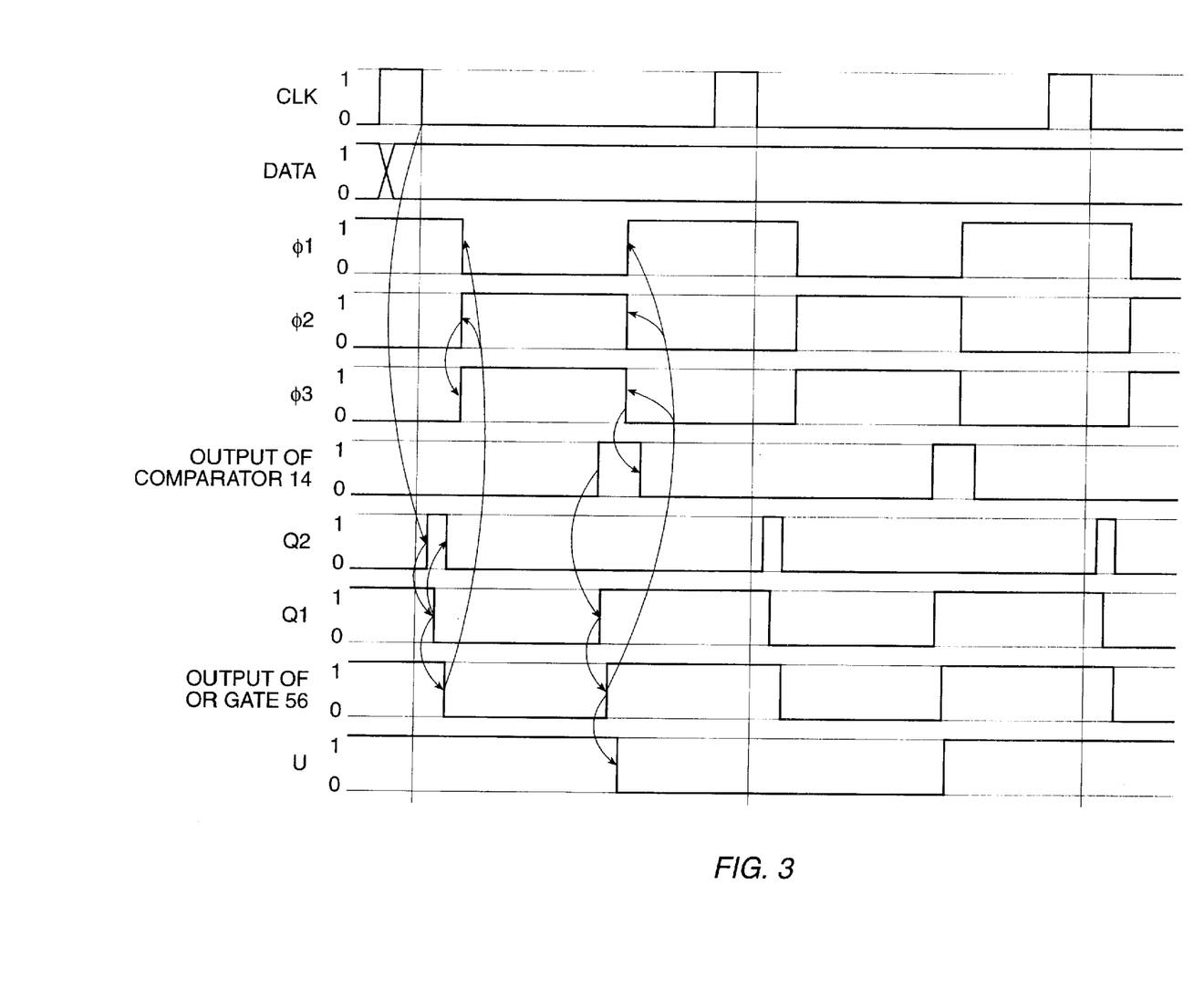
FIG. 3 illustrates timing relationships between various signals in the double-sided pulse width modulator illustrated in FIG. 1 according to the present invention.

The relationship between the CLK signal and the timing signals φ1, φ2, and φ3, can be understood upon inspection of circuit portion 42, and by reference to the timing diagrams in FIG. 3. As depicted in FIG. 3, when the CLK signal makes a transition from HIGH to LOW, the output, Q2 of second D-type flip-flop 46 makes a transition from LOW to HIGH. The output, Q2 of second D-type flip-flop 46 which is connected to the reset input of first D-type flip-flop 44, in going from LOW to HIGH causes the output, Q1, of first D-type flip-flop 44 to make a transition from HIGH to LOW, and also for the inverted output, Q1B of first D-type flip-flop 44 to make a transition from LOW to HIGH.

The inverted output, Q1B, of second D-type flip-flop 44 which is connected to the reset input of second D-type flip-flop 46, in making a transition from LOW to HIGH causes the second D-type flip-flop 46 to be reset, therefore, causing the output, Q2, of second D-type flip-flop 46 to make a transition from HIGH to LOW. At this point, because both the CLK input to OR gate 56 and the output, Q1, of first D-type flip-flop 44 are both in a LOW state, the output of OR gate 56 is also LOW. As a result, the output φ1 of first buffer circuit 50, whose input is connected to the output of OR gate 56, makes a transition from HIGH to LOW. The input of second buffer circuit 52 is also connected to the output of OR gate 56, accordingly the outputs, 42 and 43, of second buffer circuit 52 both make a transition from LOW to HIGH.

According to the present invention, when the 41 signal is HIGH, the switches 20 and 40 in FIG. 1 are turned on, and the node at the inverting input of the comparator 14, and the node at the output of the switch capacitor amplifier 12 are both charged to Vdd/2. When the CLK signal makes a transition from HIGH to LOW, the φ1 signal, as described above, also makes a transition from HIGH to LOW. The φ2 signal, whose phase is inverse to the φ1 signal, then makes a transition from LOW to HIGH.

The φ2 signal is applied to a first input of exclusive XNOR gate 24. According to the present invention, the output of the XNOR gate 24 is determined by the inputs S and U to the XNOR gate 26. This is an important feature of the present invention because the state of the bit S and the state of the output U are used to determine the polarity of the voltage transition into the first capacitor array 16-1 through 16-8. A change in voltage occurs at the output of the switched capacitor amplifier 12 due to the voltage change in the first bank of capacitors 16-1 through 16-8 connected to the inverting input of the switched capacitor amplifier 12.

Whether a capacitor in the first bank of capacitors 16-1 through 16-8 receives a logic transition to place charge on the capacitor depends upon the value of the mantissa bit supplied to the NAND gate 18-1 through 18-8 connected to the corresponding capacitor 16-1 through 16-8 respectively. When the mantissa bit being fed into the NAND gate 18-1 through 18-8 is a LOW logic level, the output of the NAND gate 18-1 through 18-8 remains HIGH, and when the mantissa bit being fed to the NAND gate 18-1 through 18-8 is a HIGH logic level, the complement of the output of the XNOR gate 24 is passed through the NAND gate 18-1 through 18-8 to the capacitors in the first bank of capacitors 16-1 through 16-8 associated with the NAND gates 18-1 through 18-8 having a HIGH logic level from the mantissa bit.

The voltage supplied to the first bank of capacitors 16-1 through 16-8 is related to the voltage supplied to the NAND gates 18-1 through 18-8. It should be appreciated that the voltage supplied to NAND gates 18-1 through 18-8 may be different than the voltage supplied to the remainder of the double-sided pulse width modulator 10, as indicated in FIG. 1 by the input signal VC. A change in the voltage to the NAND gates 18-1 through 18-8, will result in a change in the voltage output from the switched capacitor amplifier 12, and the amount of voltage stored at the inverting input of the comparator 14. Since the voltage level at the inverting input of the comparator 14 affects the discharge time, and the discharge time affects the pulse width of the output pulse, the voltage supplied to NAND gates 18-1 through 18-8 may be varied, for example, as a volume control to adjust the output.

In the operation of the double-sided pulse width modulator 10, a HIGH logic level out of the XNOR gate 24, places a LOW logic level at the outputs of the NAND gate 18-1 through 18-8 having a HIGH logic level at their mantissa bit. This increases the voltage at the inverting input into the comparator 14, which in turn increases the discharge time of the node at the inverting input to comparator 14. It should be appreciated that the discharge time of the node of the inverting input comparator 14 controls the modulation of the pulse width output, U. Accordingly, an increase in discharge time increases the pulse width of the output.

When a LOW logic level is output of the XNOR gate 24, a HIGH logic level is placed at the outputs of the NAND gate 18-1 through 18-8 having a HIGH logic level at their mantissa bit. This increases the voltage at the inverting input into the comparator 14, which reduces the discharge time of the voltage placed at the node at the inverting input of comparator 14, and therefore, the output pulse width, U, is lengthened.

Figure 4:
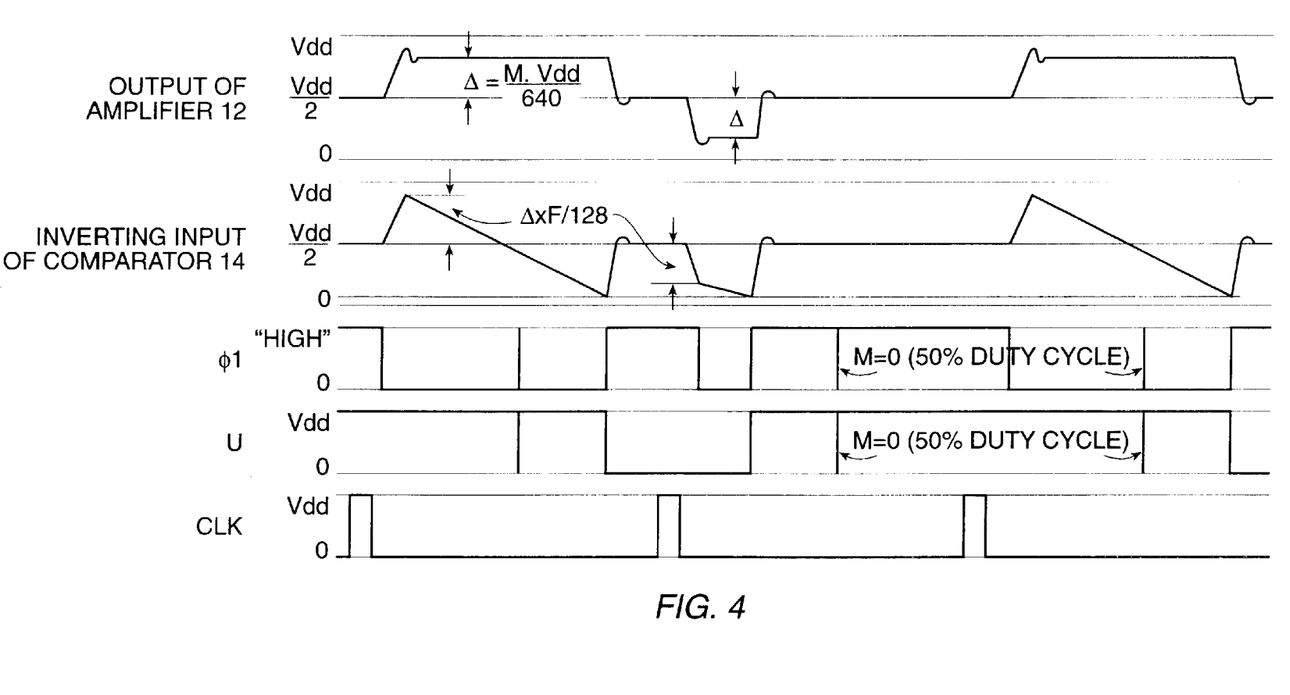
FIG. 4 illustrates the relationship between various timing signals and selected voltage levels in the double-sided pulse width modulator illustrated in FIG. 1 according to the present invention.

Referring now to FIG. 4, the first transition at the output of the switched capacitor amplifier 12 is shown as a voltage of Δ above Vdd/2. The A voltage is calculated as follows:

$$\Delta = (\text{Value of the mantissa} \times \text{Vdd})/640.$$

The Δ voltage is connected to selected ones of the second bank of capacitors 28-1 through 28-8 by the switches 30-1a through 30-7a by the outputs of the decode logic 32 according to the exponent value. As a result, a voltage is placed at the inverting input of the comparator 14 that is equal to Δ times the value of the exponent, divided by 128. The voltage at the inverting input at the comparator 14 is then discharged by N-Channel MOS transistors 34, 36 and 38. When the voltage at the inverting input of comparator 14 equals 0.1 Vdd, the output of comparator 14 makes a transition from a LOW state to a HIGH state.

The feedback capacitor 22 of the switched capacitor amplifier 12 may be sized greater than 640 C in order to reduce the Δ voltage at the output of the switched capacitor amplifier 12, as described above, and to match the starting voltage found at the node connected to the inverting input of the comparator 14 to the linear region of the current source formed N-Channel MOS transistors 34, 36 and 38. In the preferred embodiment of the double-sided pulse-width modulator shown 10, the reference voltages for the comparator 14 and the switched capacitor amplifier 12 are 0.1 Vdd and Vdd/2, respectively. These reference voltages were selected to maximize the voltage swing on the node connected to the inverting input of the comparator 14 without a loss of response from the comparator 14, without a loss of linearity in the current source formed by N-Channel MOS transistors 34, 36 and 38 and without saturation of the switched capacitor amplifier 12. The reference voltages Vdd/2 and 0.1 Vdd, and gate voltage Vbias are generated by the reference generator and current trim circuit 70 illustrated in FIG. 5.

Figure 5:
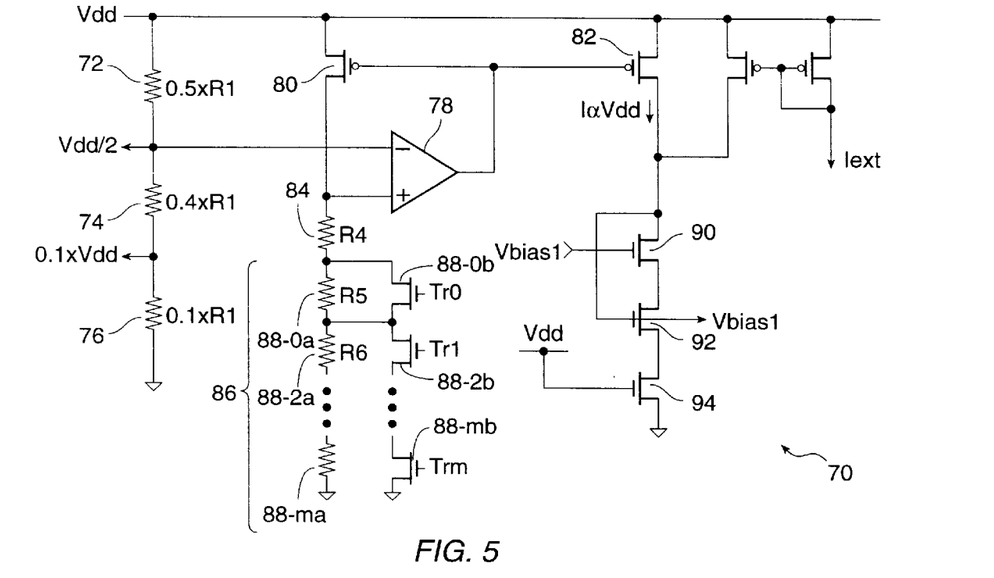
FIG. 5 illustrates a reference generator and trimming circuit suitable for use according to the present invention.

In the reference generator and current trim circuit 70, the reference voltages VDD/2 and 0.1 VDD are generated by first second, and third reference generating resistors 72, 74 and 76 connected in series between VDD and ground. The first second, and third reference generating resistors 72, 74 and 76, respectively, have a total resistance equal to R1, and individual resistances equal to 0.5 R1, 0.4 R1, and 0.1 R1, respectively. A first end of first reference generating resistor 72 is connected to VDD and a second end of first reference generating resistor 72 is connected to the inverting input of an amplifier 78, and also to a first end of second reference generating resistor 74. Accordingly, the voltage formed at the inverting input of amplifier 78 is equal to VDD/2.

A second end of the second reference generating resistor 74 is connected to a first end of third reference generating resistor 76, and the second end of third reference generating resistor 76 is connected to ground. The voltage formed at the connection between the second end of second reference generating resistor 74 and the first end of third reference generating resistor 76 is 0.1 VDD.

Referring to FIG. 5, to provide the Vbias2 voltage applied to N-Channel MOS transistor 36 illustrated in FIG.1, a current mirror is formed from P-Channel MOS transistors 80 and 82, and trimming network is formed by trim resistor 84 and variable trim resistor 86. The sources and gates of the P-Channel MOS transistors 80 and 82 are connected to VDD, and the output of amplifier 78, respectively. The drain of P channel MOS transistor 80 is connected to the non-inverting input of amplifier 78, and to a first end of the trim resistor 84. The second end of trim resistor 84 is connected to a first end of a variable trim resistor 86 formed by resistor and N-Channel transistor pairs 88-0a and 88-0b through 88-ma and 88-mb. The second end of the variable trim resistor 86 is connected to ground.

Digital trim bits Tr-0 through Tr-m are input to the N-Channel MOS transistors 88-0b through 88-mb to adjust the value of the variable trim resistor 86. The resistors 88-0a through 88-ma are weighted in binary to correspond to the binary weights associated with the trim bits Tr-0 through Tr-m. The trim bits Tr-0 through Tr-m may be provided by a non-volatile memory such as an EEPROM, and therefore may be changed to adjust the value of the variable trim resistor 86. Those of ordinary skill in the art will readily appreciate that as a result, the circuit may be trimmed and retrimmed as necessary.

Connected in series to the drain of P-Channel MOS transistor 82 are first, second and third N-Channel MOS transistors 90, 92 and 94. In the transistor series formed by first, second and third N channel MOS transistors 90, 92 and 94, the drain of N-channel MOS transistor 90 is connected to the drain of P-channel MOS transistor 82 and also to the gate of N-channel MOS transistor 92. The source of N-channel MOS transistor 90 is connected to the drain of N-channel MOS transistor 92. The drain of N-channel MOS transistor 94 is connected to the source of N-channel MOS transistor 92, and the source of N-channel MOS transistor 94 is connected to ground. The gate of N-channel MOS transistor is connected to a DC bias, Vbias1, that has been generated by an external source, and which is also connected to the gate of the N-channel MOS transistor 34 illustrated in FIG. 1. The gate of N-channel MOS transistor 94 is connected to VDD.

The voltage generated at the drain of N-channel MOS transistor 92 and also connected to the gate of N-channel MOS transistor 90 forms the voltage Vbias2 connected to the gate of N-channel MOS transistor 36 illustrated in FIG. 1. The trim resistor 84 and variable trim resistor 86 through the amplifier 78 and the current mirror 80 and 82 control the Vbias2 voltage by adjusting the variable trim resistor 86

In FIG. 1, the current flowing through first, second and third N-Channel MOS transistors 34, 36 and 38 determines the discharge time of the voltage at the inverting input of comparative 14. It is preferable that the voltage at the inverting input of comparator 14 be discharged so that the comparator 14 will trigger prior to each pulse of the CLK signal. Accordingly, for all mantissa and exponent values, the discharge current through N-channel MOS transistors 34, 36 and 38, respectively, is designed to ensure that the voltage at the input to comparator 14 is discharged to 0.1 VDD.

By adjusting the value of the Vbias2 signal with the variable trim resistor 86, the value of the discharge current can also be adjusted. Further, the current trimming provided for the Vbias2 signal can be employed to compensate for a variation in the values of the resistor 84, resistors 88-0$a$ trough 88-$ma$ used to generate the discharge current, and also for the unit capacitor values in the second bank of capacitors 28-1 through 28-8. Trimming to compensate for these, and other variations due to manufacturing tolerances helps to provide high precision output pulse widths. Also, where a loudspeaker is connected to the output of the double-sided pulse width modulator 10, trimming by the Vbias2 signal can match the output pulse width to the characteristics of the loud speaker.

Accordingly, the trim settings for a particular circuit may be modified to adjust the output amplitude as given by the pulse duty cycle at output U. The output amplitude can be trimmed to compensate for variations in individual loudspeaker characteristics, as may occur due to manufacturing variations. It will also be appreciated by those of ordinary skill in the art that since the Vbias2 signal is proportional to Vdd, any variations in the Δ voltage are compensated for because the Δ voltage is also proportional to Vdd.

Turning again to FIG. 3, when the output of the comparator 14 makes a transition from a LOW state to a HIGH state, the output, Q1 of the first D type flip-flop 44 follows. The Q1 output through OR gate 56 results in the $\phi$1 signal making a transition from a LOW state to a HIGH state, the $\phi$2 signal making a transition from a HIGH state to a LOW state, the $\phi$3 signal making a transition from a HIGH state to a LOW state, and the output, U, of third D-type flip-flop 48 making a change of state. It should be noted that when the $\phi$3 signal makes the transition from HIGH to LOW that the comparator 14 output which is controlled by the 43 signal also makes a transition from HIGH to LOW. When the $\phi$1 signal goes HIGH, the output of the switched capacitor amplifier 12 and the inverting input of the comparator 14 are again set to Vdd/2.

On the next transition of the clock from HIGH to LOW, the process described above is repeated. Referring to FIG. 4, due to the state of the output U, the Δ voltage at the output of the switched capacitor amplifier 12 due to the mantissa value is negative. This Δ voltage is passed through to the input of the comparator 14, and is thereafter discharged through the transistors 34, 36 and 38. When the voltage at the inverting input of the comparator is discharged to 0.1 Vdd the output of the comparator 14 makes the transition from a LOW state to a HIGH state.

As described above, this causes the $\phi$1 signal to make a transition from a LOW state to a HIGH state, and the $\phi$2 and $\phi$3 signals to make a transition from a HIGH state to a LOW state. However, in contrast to the description made above, the output of the third D-type flip-flop 44, now makes the transition from a LOW state to a HIGH state. From the two clock cycles just described, it will be appreciated by those of ordinary skill in the art that the falling edge of the output, U, was initiated by the first clock pulse, and that the rising edge of the output, U, was initiated by the second clock pulse. Also from the two clock signals just described, it will be appreciated that the first, falling, edge of output, U, is delayed by an amount related to the value of inputs m0–m7 and e0–e2, and that the second, rising, edge is earlier by an equal amount also related to the inputs m0–m7 and e0–e2. Accordingly, it can be observed that the pulse width is modulated on both sides, and that in two cycles of operation and two clock pulses the modulation is performed. The dashed lines in the waveforms of FIG. 4 correspond to a 50% duty cycle and a net zero output level the bits m0–m7 are 00000000.

To determine whether a HIGH or LOW logic level is output from the XNOR gate 24 to either increase or decease the width of the output pulse, several cases must be considered. When the output, U, is at a HIGH logic level, and the sign bit, S, is also at a HIGH logic level, the positive edge of the $\phi$2 signal creates a HIGH logic level output of XNOR gate 24. As explained above, the HIGH signal into the first bank of capacitors 16-1 through 16-8 reduces the discharge time at the node connected to the inverting input of the comparator 14 and, therefore, reduces the width of the HIGH state of the output U.

During, the next cycle, consider the value of the output, U, being at a LOW logic state and the sign bit, S, still being HIGH. In this case, the positive edge of the signal $\phi$2 creates a LOW signal into the first bank of capacitors 16-1 through 16-8 to lengthen the LOW state of the output, U, thereby shortening the next successive pulse width.

Considering when the output, U, is equal to the HIGH state and the sign bit, S, is equal to a LOW state, the positive edge of the $\phi$2 signal will again place a LOW signal into the first bank of capacitors 16-1 through 16-8. As a result, the length of the HIGH signal for the output, U, will be increased, and therefore the pulse width will be lengthened.

When the sign bit, S, is a LOW signal, and the output, U, is at a LOW transition state, there will be a HIGH edge into the first bank of capacitors 16-1 through 16-8 which will reduce the length of the LOW state of the output, U, to lengthen the pulse width. Accordingly, it can be observed then that when signed, S, is a HIGH logic level, the positive pulse width of output, U, will be reduced, and when signed, S, is a LOW logic level, the positive width of output, U, will be increased.

According to the present invention several alternative embodiments for the second portion of the double sided pulse width modulator 10 depicted in FIG. 1, are illustrated in FIGS. 6, 7, 8, 9, and 10. For those portions of FIGS. 6–10, that are the same as the embodiment illustrated in FIG. 1 the reference numerals have been retained.

Figure 6:
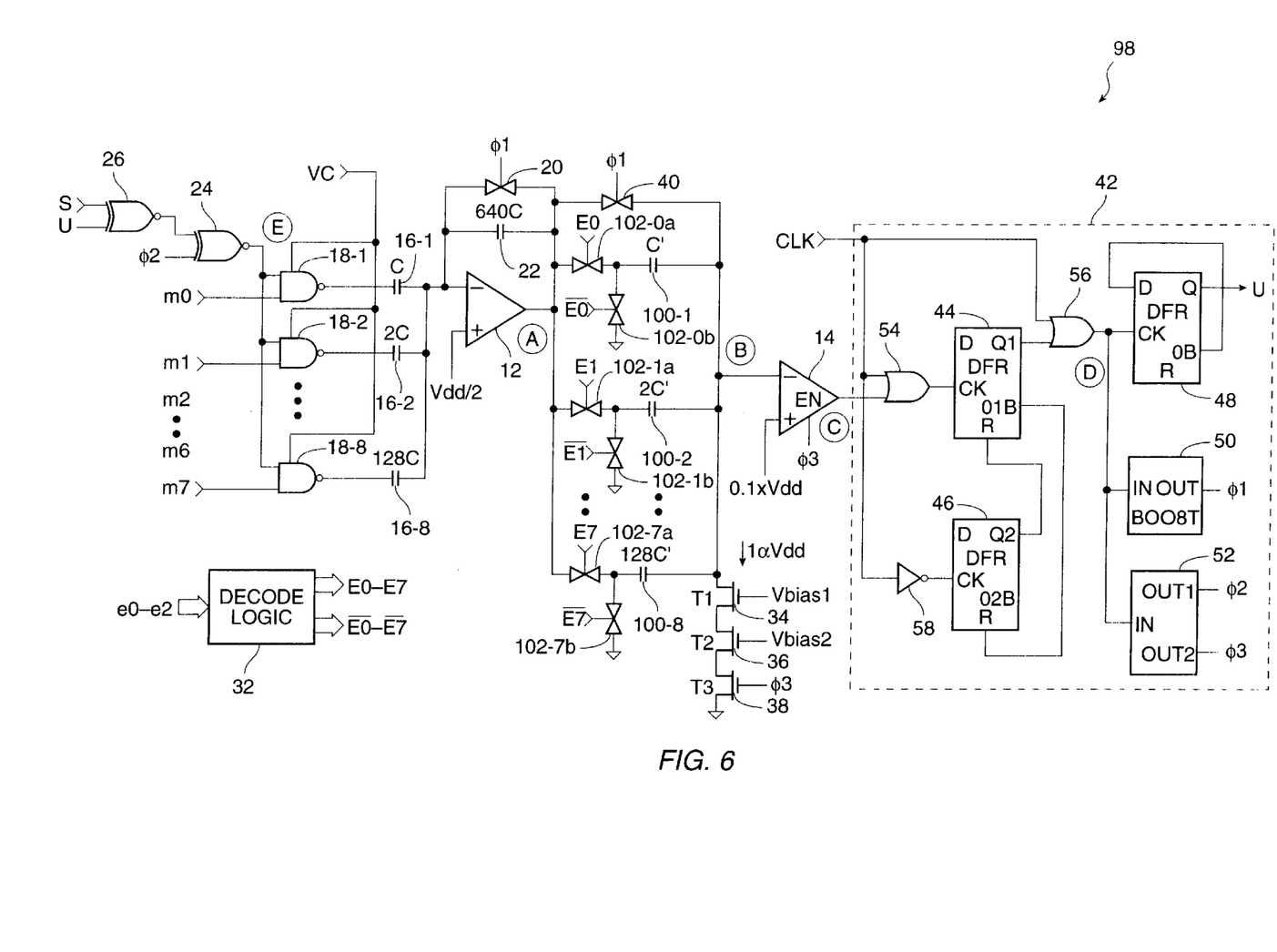
FIGS. 6–10 illustrate alternative embodiments of a double-sided pulse width modulator according to the present invention.

Turning now to FIG. 6, in a first alternative embodiment of double sided pulse-width modulator 98, the second bank of capacitors 28-1 through 28-8, and the pairs of switches 30-1$a$ and 30-1$b$ through 30-7$a$ and 30-7$b$ depicted in FIG. 1 are replaced by a bank of capacitors 100-1 through 100-8, and the pairs of switches 102-0$a$ and 102-0$b$ through 102-7$a$ and 102-7$b$. In FIG. 6, one side of each of the capacitors in the second bank of capacitors 100-1 through 100-8 is connected to the inverting input node of comparator 14, and a second side of each of the capacitors 100-1 through 100-8 is connected to a pair of switches 102-0$a$, and 102-0$b$ through 102-7a and 102-7b. The capacitor values for the capacitors 100-1 through 100-8 in the second bank of capacitors are C', 2 C', 4 C', 8 C', 16 C', 32 C', 64 C', and 128 C'.

Figure 11:
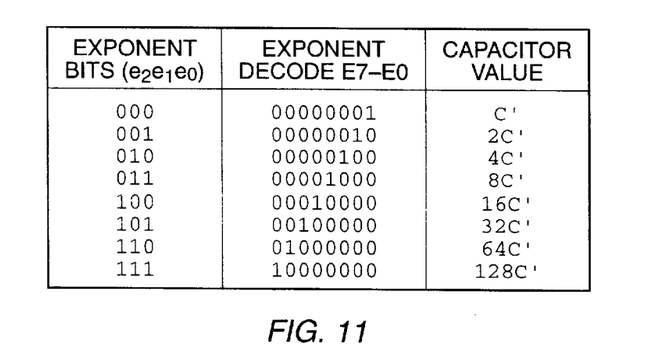
FIG. 11 illustrates an alternative decode scheme for exponent bits suitable for use according to the present invention.

The decoding scheme of the decode logic 32 for the pairs of switches 102-0a, and 102-0b through 102-7a and 102-7b for this alternative embodiment is depicted in FIG. 11. From the decoding scheme it can be observed that only one of the switches 102-0a through 102-7a is conducting at any one time. The remaining elements in FIG. 6 operate as described above with regard to FIG. 1.

Figure 7:
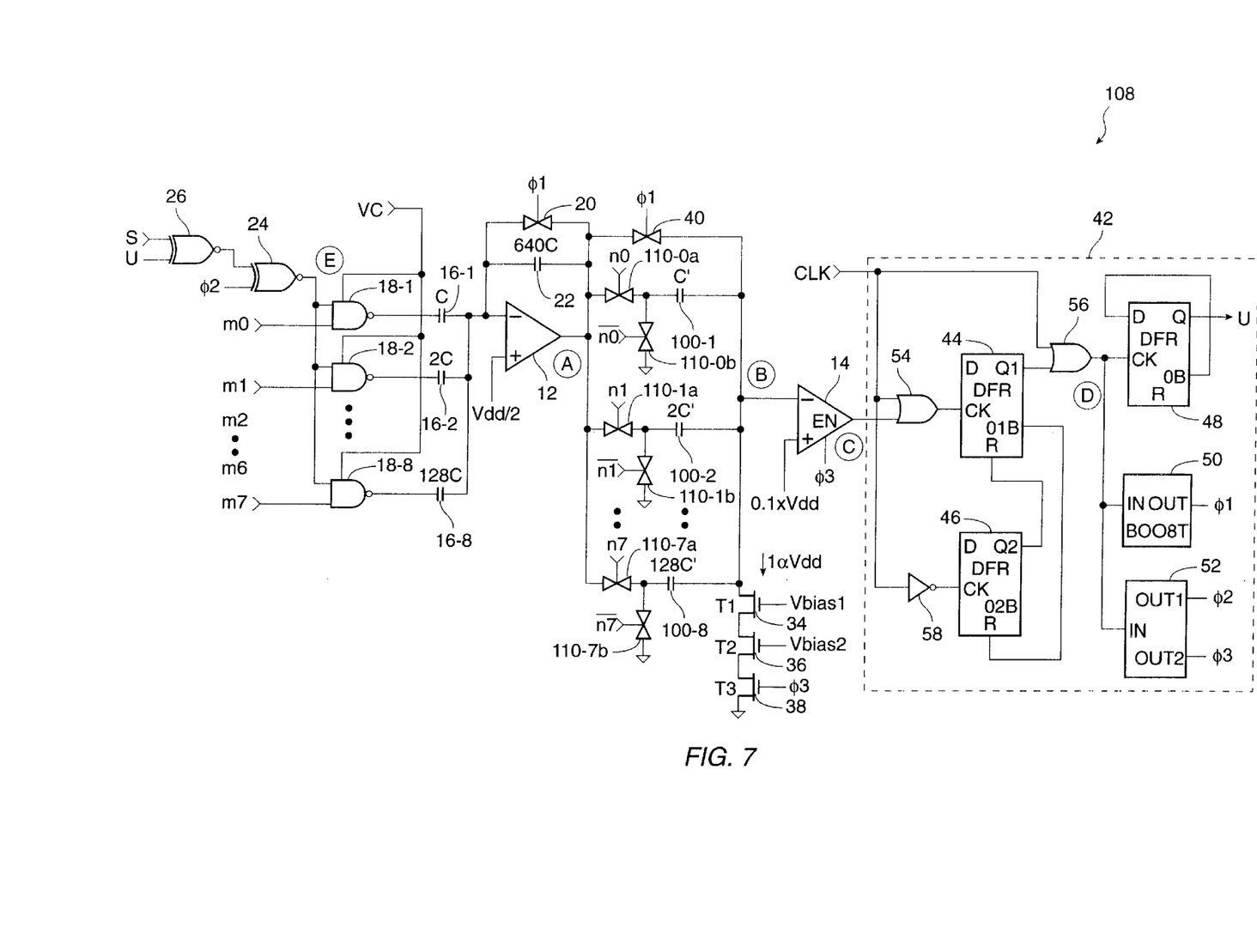

Turning now to FIG. 7, in a second alternative embodiment of double sided pulse-width modulator 108, the decode logic 32 illustrated in FIG. 6 has been eliminated, and a second set of binary inputs n0–n7 and their compliments, control the pairs of switches 110-0a and 110-0b through 110-7a and 110-7b. Accordingly, in the embodiment depicted in FIG. 7, the output pulse width of the double-sided modulator 10 will be proportional to the product of the mantissa bits m0–m7, and the binary word n0–n7.

Figure 8:
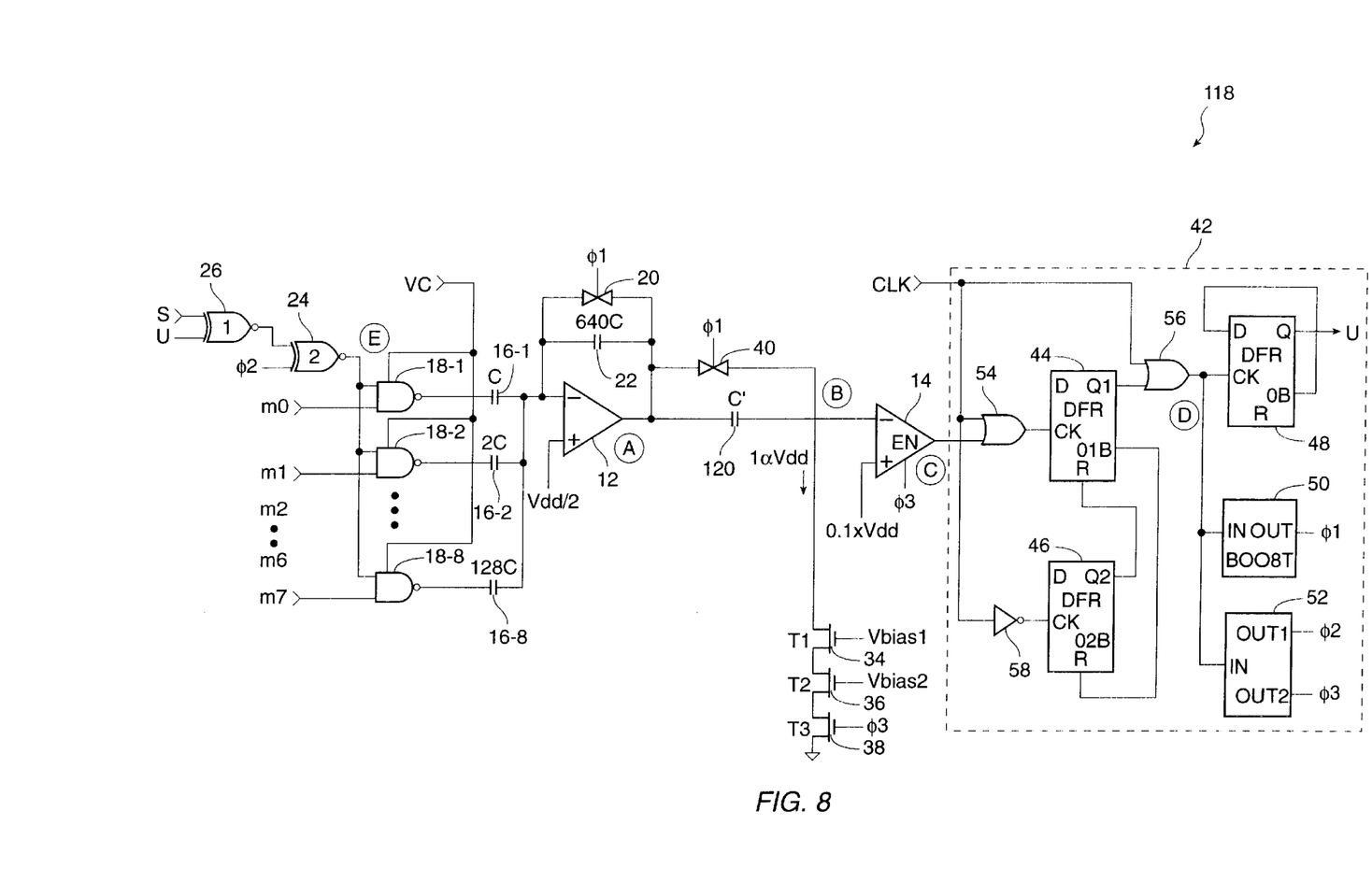

Turning now to FIG. 8, in a third alternative embodiment of double sided pulse-width modulator 118, the second bank of capacitors 28-1 through 28-8, and the pairs of switches 30-1a and 30-1b through 30-7a and 30-7b depicted in FIG. 1 are replaced by a single capacitor 120 having a value of C'. According to this embodiment, the digital input consists of the mantissa bits m0–m7, and the sign bit S. As a further alternative to this embodiment, the sign bit S and the XNOR gate 26 are eliminated, and the output U is connected to the second input of XNOR gate 24. Accordingly, the pulse out width, U, is a function of the mantissa bits m0–m7.

Figure 9:
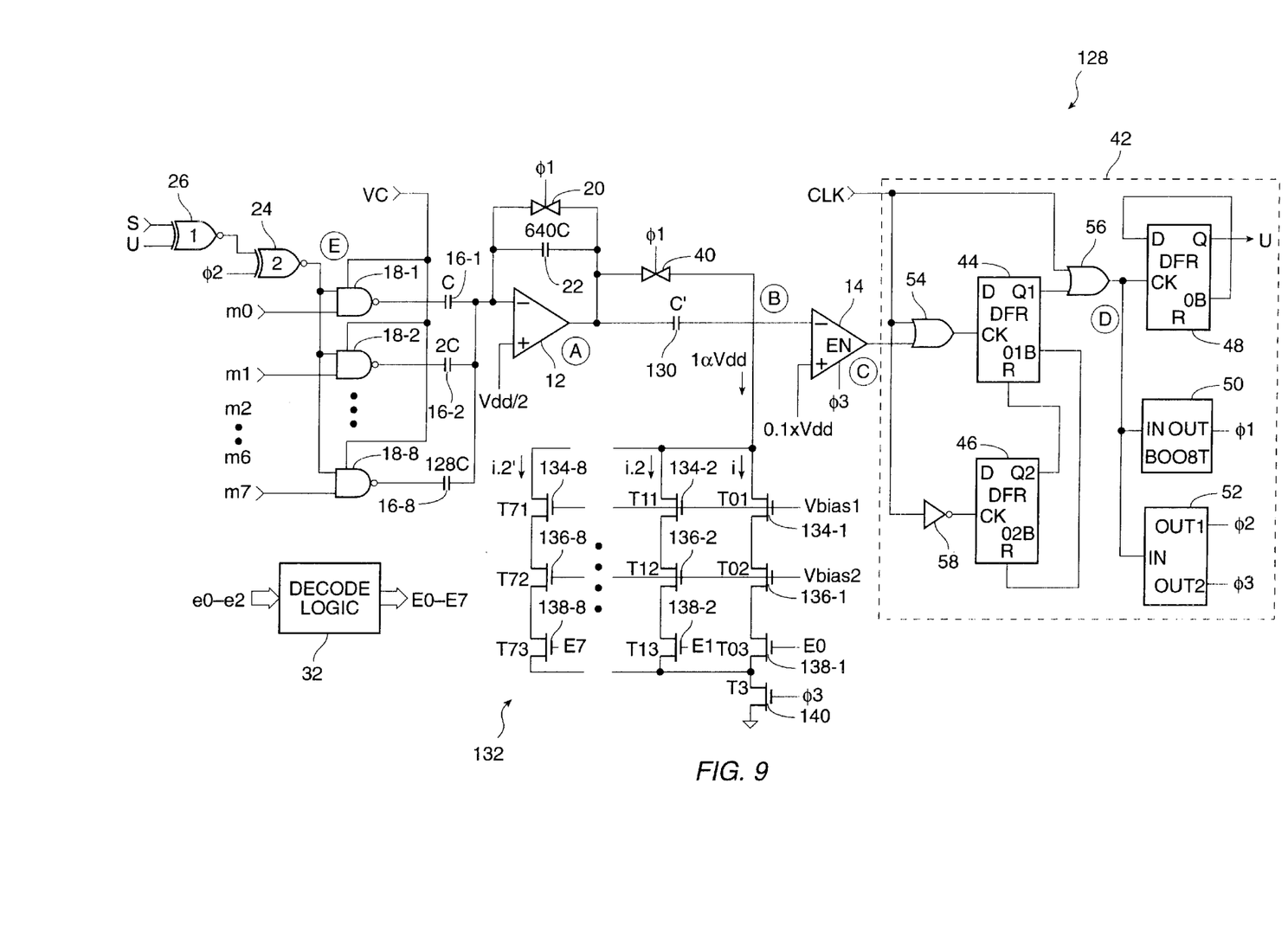

Turning now to FIG. 9, in a fourth alternative embodiment of double sided pulse-width modulator 128, the second bank of capacitors 28-1 through 28-8, and the pairs of switches 30-1a and 30-1b through 30-7a and 30-7b depicted in FIG. 1 are replaced with a single capacitor 130 and an array of switched current devices 132. In the array of switched current devices 132, each transistor in a first set of N-channel MOS transistor 134-1 through 134-8 has a drain connected to the inverting input of comparator 14 and a source connected to a drain of one of the transistors in a second set of N-channel MOS transistors 136-1 through 136-8. Each of the sources in the second set of N-channel MOS transistors 136-1 through 136-8 is connected to a drain of one of the transistors in a third set of N-channel MOS transistors 138-1 through 138-8. The source of each of the transistors in the third set of N-channel MOS transistors 138-1 through 138-8 is connected to the drain of an N-channel MOS transistor 140. The source of N-channel MOS transistor 140 is connected to ground.

The gates of each of transistors in the first set of N-channel MOS transistors 134-1 through 134-8 is connected to VBIAS1. The gates of the transistors in the second set of N-channel MOS transistors 136-1 through 136-8 are connected to VBIAS2. The gates of the transistors in the third set of N-channel MOS transistors 138-1 through 138-8 are connected to the outputs E0–E7 of the decode logic 32, respectively. The gate of N-channel MOS transistor 140 is connected to timing signal φ3 as described above.

In contrast to the variable capacitor array and fixed current sink described in FIG. 1, the capacitor 130 and the array of switched current devices 132 provide a fixed capacitor and a variable current sink. In the array of switched current devices 132, the first, second and third sets of N-channel MOS transistors 134-1 through 134-8, 136-1 through 136-8 and 138-1 through 138-8, are scaled so that the current passing through each string of three series transistors, 134, 136, and 138 provides a binary weighing assigned to the decode signals E0–E7 from the decode logic 32.

Figure 10:
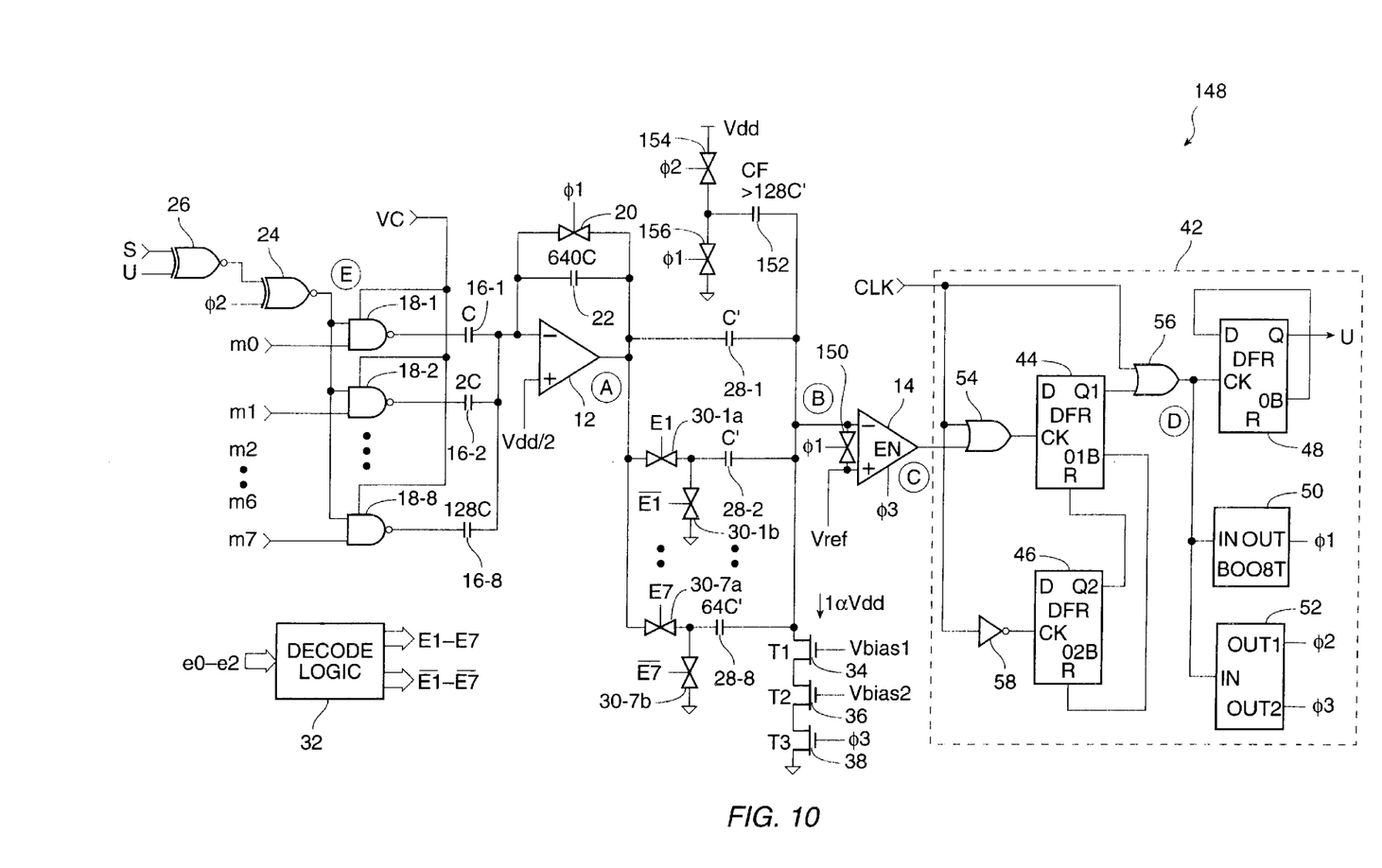

Turning now to FIG. 10, in a fifth alternative embodiment of double sided pulse-width modulator 148, a switch 150 that is controlled by the first timing signal φ1 is disposed between the inverting and non-inverting input of comparator 14. In this alternative embodiment the non-inverting input is connected to a Vref so that when the first timing signal φ1 is high, the inverting input of comparator 14 is initialized to Vref. The value of Vref is preferably Vdd/2 to provide maximum output amplitude. After the initialization of inverting input of comparator 14 to Vref by the first timing signal φ1, a positive voltage is applied to the inverting input of comparator 14 through capacitor 152 and switch 154 that is controlled by the second timing signal φ2. The capacitor 152 is scaled to be greater than 128 C' so that when the voltage VC described above is less than or equal to Vdd, the voltage at the inverting input of comparator 14 will be greater than the voltage $V_{ref}$ placed at the inverting input of comparator 14 by the first timing signal φ1.

It should be appreciated that when the second timing signal φ2 is HIGH as described above, the voltage at the output of switched capacitor amplifier 12 will change by an amount of Δ V. Accordingly, the voltage at the inverting input of comparator 14 at the beginning of the discharge period will be due to the amount of Δ V at the output of switched capacitor amplifier 12 multiplied by the selected capacitors in the second bank of capacitors 28-1 through 28-8, and also due to Vdd multiplied by capacitor 152. Accordingly, in a manner similar to the operation of the double-sided pulse width modulator depicted in FIG. 1, as the inverting input of comparator 14 is discharged in response to third timing signal φ3, the discharge time at the inverting input of comparator 14 is either increased or decreased by an amount related to the product of the mantissa bits m0–m7 and the exponent values from the decode logic 32 to modulate the output, U.

While not explicitly described herein, it should be appreciated by those of ordinary skill in the art that single-sided modulation may be obtained from the embodiments described herein with only slight modification. For example, single-sided modulation may be obtained by positioning the output pulse edges of a first transition direction at a constant time delay with respect to the input clock, and by positioning, as described in the embodiments set forth above, the output pulse edges of a second transition direction at a variable time delay with respect to the input clock.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A double-sided pulse width modulator comprising:
an amplifier having a first input, a second input, and an output, said first input connected to a first reference potential;
a first bank of storage elements, each of said storage elements having a first terminal connected to said second input of said amplifier, and a second terminal;
a first bank of switches, each switch in said first bank of switches having an output terminal connected to a second terminal of said storage elements, an input terminal, and a control terminal connectable by a timing gate to an output of said modulator and a polarity control bit for a first value to be input into said input terminals;

a feedback storage element connected in parallel with a first timing switch between said second input of said amplifier and said output of said amplifier;

a comparator having a first input connected to a second reference potential, a second input, a timing enable input, and an output;

a second bank of storage elements, each of said storage elements having a first terminal connected to said second input of said comparator, and a second terminal;

a second timing switch connected in parallel with a first one of said storage elements of said second bank of storage elements between said output of said amplifier and said second input of said comparator;

a second bank of switches, each of said switches having a first terminal connected to one of said storage elements in said second bank of storage elements other than said one storage element, a second terminal connected to said output of said amplifier, and a control terminal connected to a second input value; and a current source connected to said second input of said comparator, said current source discharging a value having a duration proportional to the product of said first input value and said second input value to form said output of said modulator at said output of said comparator.

2. A double-sided pulse width modulator comprising:

an amplifier having a first input, a second input, and an output, said first input connected to a first reference potential;

a first bank of storage elements, each of said storage elements having a first terminal connected to said second input of said amplifier, and a second terminal;

a first bank of switches, each switch in said first bank of switches having an output terminal connected to a second terminal of said storage elements, an input terminal, and a control terminal connectable by a timing gate to an output of said modulator and a polarity control bit for a first value to be input into said input terminals;

a feedback storage element connected in parallel with a first timing switch between said second input of said amplifier and said output of said amplifier;

a comparator having a first input connected to a second reference potential, a second input, a timing enable input, and an output;

a second bank of storage elements, each of said storage elements having a first terminal connected to said second input of said comparator, and a second terminal;

a second timing switch connected between said output of said amplifier and said second input of said comparator;

a second bank of switches each of said switches having a first terminal connected to one of said storage elements in said second bank of storage elements, a second terminal connected to said output of said amplifier, and a control terminal connected to a second value; and a current source connected to said second input of said comparator, said current source discharging a value having a duration proportional to the product of said first input value and said second input value to form said output of said modulator at said output of said comparator.

3. A double-sided pulse width modulator comprising:

an amplifier having a first input, a second input, and an output, said first input connected to a first reference potential;

a first bank of storage elements, each of said storage elements having a first terminal connected to said second input of said amplifier, and a second terminal;

a first bank of switches, each switch in said first bank of switches having an output terminal connected to a second terminal of said storage elements, an input terminal, and a control terminal connectable by a timing gate to an output of said modulator and a polarity control bit for a first value to be input into said input terminals;

a feedback storage element connected in parallel with a first timing switch between said second input of said amplifier and said output of said amplifier;

a comparator having a first input connected to a second reference potential, a second input, a timing enable input, and an output;

a second bank of storage elements, each of said storage elements having a first terminal connected to said second input of said comparator, and a second terminal;

a second timing switch connected in parallel with a first one of said storage elements of said second bank of storage elements between said output of said amplifier and said second input of said comparator; and a current source connected to said second input of said comparator, said current source discharging a value having a duration proportional to the first input value to form said output of said modulator at said output of said comparator.

* * * * *

UNITED STATES PATENT AND TRADEMARK OFFICE
CERTIFICATE OF CORRECTIOϕN

PATENT NO. : 5,963,106
DATED : October 5, 1999
INVENTOR(S) : Trevor A. Blyth, Benjamin E. Nise. and David A. Wayne It is certified that error appears in the above-identified patent and that said Letters Patent is hereby corrected as shown below:

Column 4,
Line 11, please replace "signal, 43," with --signal ϕ3,--.

Column 6,
Line 31, please replace "outputs, 42 and 43," with --outputs, ϕ2 and ϕ3,--.
Line 33, please replace "the 41 signal" with --the ϕ1 signal--.

Column 7,
Line 37, please replace "The A voltage" with --The Δ voltage--.

Column 9,
Line 50, please replace "the 43 signal" with --the ϕ3 signal--.

FIG. 1 should include Vdd input to the D register in D-type flip-flops 44 and 46.

FIG. 4 should have dashed lines pointing from the demarcation "M=0 (50% DUTY CYCLE)".

FIG. 5 should label the output from the gate at transistor 92 as Vbias2 rather than Vbias1.

FIG. 6 should include Vdd input to the D register in D-type flip-flops 44 and 46.

FIG. 7 should include Vdd input to the D register in D-type flip-flops 44 and 46.

FIG. 8 should include Vdd input to the register in D-type flip-flops 44 and 46, and a junction dot at the line crossing adjacent to the circled "B".

FIG. 9 should include Vdd input to the D register in D-type flip-flops 44 and 46, and a junction dot at the line crossing adjacent to the circled "B".

FIG. 10 should include Vdd input to the D register in D-type flip-flops 44 and 46.

UNITED STATES PATENT AND TRADEMARK OFFICE
CERTIFICATE OF CORRECTION

PATENT NO. : 5,963,106
DATED : October 5, 1999
INVENTOR(S) : Trevor A. Blyth, Benjamin E. Nise. and David A. Wayne It is certified that error appears in the above-identified patent and that said Letters Patent is hereby corrected as shown below:

Column 1,
Line 37, please replace "IEE" with --*IEEE*--.
Line 38, please replace "Proc," with --*Proc.*,--.
Line 56, please replace "Temes" with --Temes, eds.,--.

Column 2,
Line 3, please replace "It will" with --It will be--.
Line 4, please replace "aids low, low" with --aids, low--.
Line 15, please replace "potion" with --portion--.

Column 4,
Line 12, please replace "through 24-8" with --through 28-8--.
Line 27 and 30, please replace "and 28-1 and 28-8" with --and 28-1 through 28-8--.

Column 5,
Line 30, please replace "the operation double-sided" with --the operation of double-sided--.
Line 30, please replace "module 10," with --modulator 10,--
Line 56, please replace "cascode" with --cascade--.
Line 62, please replace "give" with --given--.

Column 7,
Line 30, please replace "This increases" with --This decreases--.

Column 8,
Line 6, please replace "voltages VDD/2 and 0.1 VDD" with --voltages Vdd/2 and 0.1 Vdd--.
Lines 8 and 13, please replace "VDD and" with --Vdd and--.
Line 17, please replace "VDD/2," with Vdd/2--.
Line 24, please replace "0.1 VDD." with --0.1 Vdd--.
Line 31, please replace "VDD, and" with --Vdd, and--.
Line 62, please replace "sistor is" with --sistor 90 is--.
Line 65, please replace "VDD." with --Vdd.--.
Line 67, please replace "transistor 92" with --transistor 90--.

UNITED STATES PATENT AND TRADEMARK OFFICE
CERTIFICATE OF CORRECTION

PATENT NO. : 5,963,106
DATED : October 5, 1999
INVENTOR(S) : Trevor A. Blyth, Benjamin E. Nise, and David A. Wayne It is certified that error appears in the above-identified patent and that said Letters Patent is hereby corrected as shown below:

Column 9,
Line 1, please replace "transistor 90" with --transistor 92--.
Line 5, a period should be inserted after "variable trim resistor 86".
Line 16, please replace "VDD." with --Vdd.--.
Line 22, please replace "trough" with --through--.

Column 10,
Line 17, please replace "level the" with --level; the--.
Lines 47 and 48, please replace "signed," with --sign bit,--.

Column 11,
Line 19, please replace "modulator 10" with --modulator 108--.
Line 53, please replace "VBIAS1." with Vbias1.--.
Line 55, please replace "VBIAS2." with --Vbias2.--.

Column 12,
Line 20, please replace "voltage $V_{ref}$" with --voltage Vref--.

Signed and Sealed this

Nineteenth Day of June, 2001

*Attest:*

*Attesting Officer*

NICHOLAS P. GODICI
*Acting Director of the United States Patent and Trademark Office*